US006958711B2

(12) United States Patent
Hauf

(10) Patent No.: US 6,958,711 B2
(45) Date of Patent: Oct. 25, 2005

(54) KEYBOARD

(75) Inventor: Ronald Hauf, Möhrendorf (DE)

(73) Assignee: Siemens Aktiengesellschaft, München (DE)

( * ) Notice: Subject to any disclaimer, the term of this patent is extended or adjusted under 35 U.S.C. 154(b) by 483 days.

(21) Appl. No.: 10/292,891

(22) Filed: Nov. 12, 2002

(65) Prior Publication Data

US 2003/0090396 A1 May 15, 2003

(30) Foreign Application Priority Data

Nov. 12, 2001 (DE) ........................................ 101 55 421

(51) Int. Cl.[7] ................................................ H03M 11/00

(52) U.S. Cl. ........................... 341/22; 341/26; 324/423; 200/5 A; 200/6 R

(58) Field of Search ................................ 340/2.5, 10.3, 340/14.1; 341/22, 26; 200/5 A, 6 R

(56) References Cited

U.S. PATENT DOCUMENTS 3,761,945 A * 9/1973 Engle ......................... 340/2.5
4,326,194 A * 4/1982 Pepe ........................... 341/22
4,532,497 A * 7/1985 Danish ........................ 341/22
6,417,787 B1 * 7/2002 Hsu ............................ 341/26
6,486,674 B2 * 11/2002 Groenewold et al. ....... 324/423
6,828,902 B2 * 12/2004 Casden ...................... 340/10.3

FOREIGN PATENT DOCUMENTS

DE 25 17 903 11/1975
DE 199 46 471 A1 3/2001

* cited by examiner

*Primary Examiner*—Michael Horabik
*Assistant Examiner*—Sisay Yacob
(74) *Attorney, Agent, or Firm*—Henry I. Feiereisen

(57) ABSTRACT

A keyboard includes a plurality of key elements arranged in rows and columns in a matrix-like manner. Each key element has first and second break contacts which are decoupled for safety reasons and are commonly activated when the key element is actuated. An energy supply unit feeds to an evaluation unit electric energy serially via the first break contacts for each separate column and serially via the second break contacts for each separate row. In this way the location of the key element actuation can be reliably ascertained through column and row detection.

4 Claims, 2 Drawing Sheets

KEYBOARD

CROSS-REFERENCES TO RELATED APPLICATIONS

This application claims the priority of German Patent Application Serial No. 101 55 421.4, filed Nov. 12, 2001, pursuant to 35 U.S.C. 119(a)–(d), the disclosure of which is incorporated herein by reference.

BACKGROUND OF THE INVENTION

The present invention relates to a keyboard of a type including a plurality of key elements.

German pat. publication no. DE 199 46 471 A1 describes a keyboard of this type in which each key element includes two separate break contacts which are mechanically decoupled and commonly activated, when the key element is actuated. One of the break contacts is of mechanical construction whereas the other break contact is of electronic construction. Each key element has 2*2, i.e. four contact terminals, as output for both break contacts. Thus, n key elements require 4*n contact terminals, when the key elements are connected together to form the keyboard. An exemplified key element of this type is also shown in FIG. 1. Dash-dotted line SE1 denotes a switching element of a safety-oriented key element, including two break contacts O11 and O12 which are opened together, when the key element (not shown) is actuated, so that signals can be tapped on contact terminals K11 and K12 of the break contact O11, and contact terminals K21 and K22 signal that the break contact O12 is activated.

Even when reducing the output per key element to three contact terminals by realizing a common base contact, the keyboard still requires 3*n contact terminals per key element. An exemplified key element of this type is shown in FIG. 2 and includes a switching element SE2 with break contacts O21 and O22, whereby two base contact terminals are united to a single contact terminal K3, while the other two contact terminals of the break contacts O21, O22 are separated from one another and designated by reference numerals K4 and K5.

To date, when the key elements are linked together to form a keyboard, typically all contact terminals are connected individually to energy supply units and evaluation units. As a result, the number of external connections is considerable.

It would therefore be desirable and advantageous to provide an improved keyboard to obviate prior art shortcomings and to minimize the number of external wiring lines.

SUMMARY OF THE INVENTION

According to one aspect of the present invention, a keyboard includes a plurality of key elements arranged in rows and columns in a matrix-like manner, each key element including first and second break contacts which are decoupled for safety reasons and are commonly activated, when the key element is actuated, and an energy supply unit electrically connected to an evaluation unit serially via the first break contacts separately for each of the columns, and serially via the second break contacts separately for each of the rows, thereby enabling the evaluation unit to ascertain actuation of a key element through column and row detection.

The present invention resolves prior art problems by applying for the first time a column-row concept for reducing the number of external terminals. At x columns and y rows, the number of outer terminals is thus 2*(x+y). As a consequence, when the keyboard has many columns and rows, the number of external lines is significantly reduced.

According to another feature of the present invention, the energy supply unit may generate test signals with defined signal pattern so that the evaluation unit can monitor compliance therewith. In this way, test routines can be realized for monitoring purposes for the key elements outside the actuation period which is relatively short in relationship to the total duration.

In the event, the keyboard is composed of several fields in side-by-side disposition, or some portions of the keyboard should remain idle for indicating elements or like equipment, it may be suitable to bridge keyless matrix fields electrically through electric paths.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
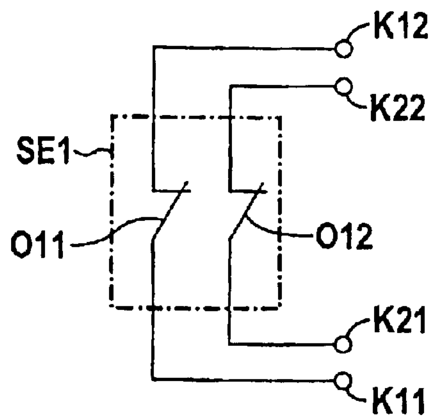
FIG. 1 is a principal circuit diagram of a conventional safety-oriented key element of a keyboard.
Figure 2:
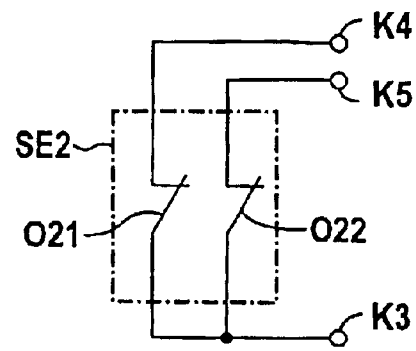
FIG. 2 is a principal circuit diagram of another conventional safety-oriented key element of a keyboard.
Figure 3:
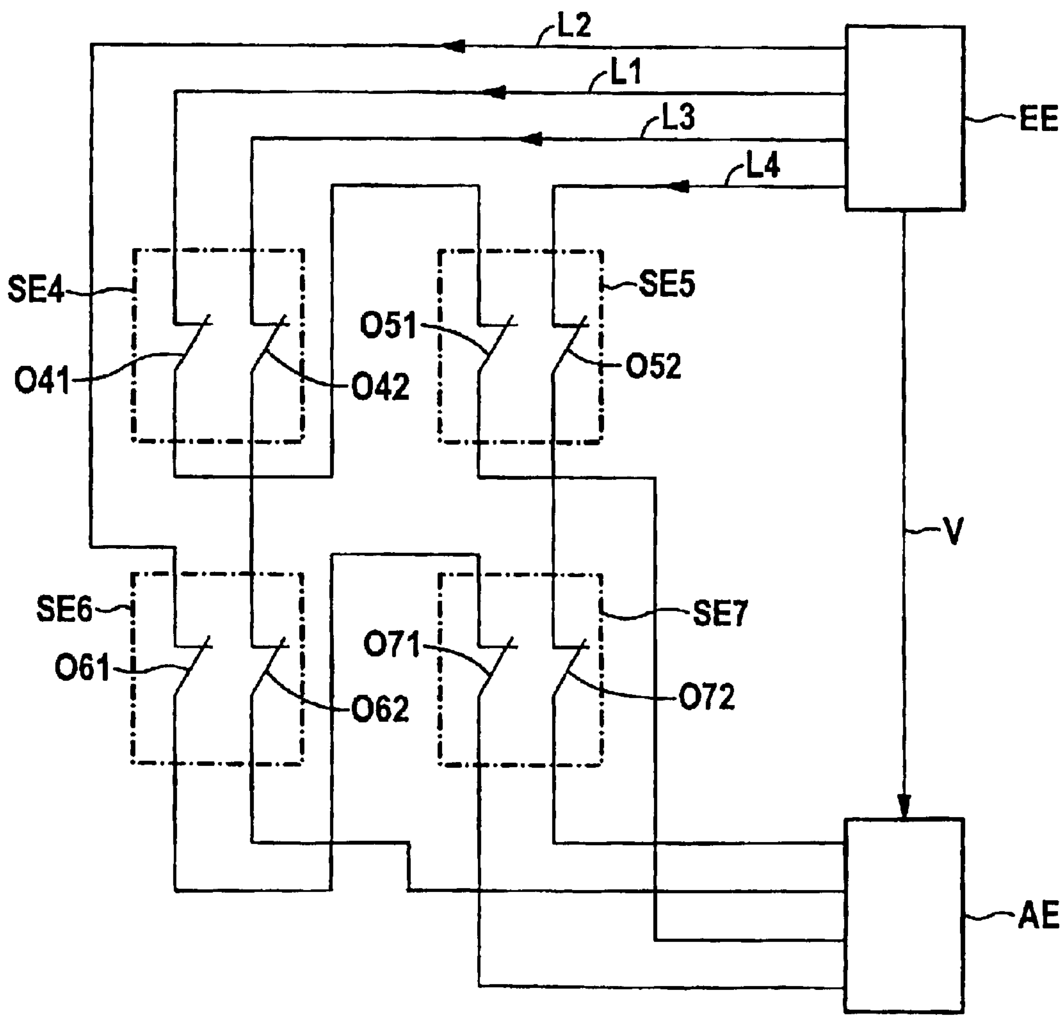
FIG. 3 is a circuit diagram of a keyboard according to the present invention.

Turning now to the drawing, and in particular to FIG. 3, there is shown a circuit diagram of a keyboard according to the present invention incorporating the column-row concept. In the following description, the principal configuration of a keyboard according to the present invention is explained with reference to the simplest scenario comprised of two rows and two columns to form a keyboard with four key elements, whereby each key element is associated to a switching unit. For the sake of simplicity and ease of illustration, the individual key elements are not shown in the drawing. As shown in FIG. 3, the keyboard has switching units SE4 and SE5 with associated break contacts O41 and O51 to form the upper row of the keyboard, and switching elements SE6 and SE7 with associated break contacts O61 and O71 to form the lower row of the keyboard. In addition, the switching units SE4 and SE6 define with break contacts O42 and O62 the left column of the keyboard, while the switching units SE45 and SE7 define with break contacts O52 and O72 the right column of the keyboard.

Line 1 carries an electric signal of an energy supply unit EE via the break contacts O41, O51, i.e. via the upper row of the keyboard, to an evaluation unit AE. Line 2 carries an electric signal of the energy supply unit EE via the break contacts O61, O71, i.e. via the lower row of the keyboard, to the evaluation unit AE. Line 3 carries an electric signal of the energy supply unit EE via the break contacts O42, O62 to the evaluation unit AE, so that the left column of the keyboard is interrogated. Line 4 carries an electric signal of the energy supply unit EE via the break contacts O52, O72 to the evaluation unit AE, so that the right column of the keyboard is interrogated.

The keyboard operates as follows: When, for example, the evaluation unit AE determines that no signal is transmitted through the line L4 and also through L1, the switching element SE5 is activated, which means that the key element associated to the switching element SE5 has been actuated, as the normally closed break contacts O51 and O52 are now open. When the switching element SE7 is addressed, as the associated key element is actuated, the normally closed break contacts O71, O72 are opened so that the evaluation unit AE registers no signal in lines L2, L4. No signals in lines L2, L3 means that switching element SE6 has been addressed (break contacts O61, O62 are now open), while no signal in lines L1, L3 means that switching element SE4 has been addressed (break contacts O41, O42 are now open).

Basically, it is possible, that the energy supply unit EE impresses permanent signals, e.g. dc voltages, upon the circuit, whereby the evaluation unit AE then detects interruptions in the rows and columns to infer therefrom which of the key elements has been actuated. Of course, as shown in FIG. 3, it is also conceivable to provide a bidirectional connection V between the evaluation unit AE and the energy supply unit EE for so coordinating the evaluation unit AE and the energy supply unit EE that respective test signals are triggered with defined signal pattern. Of course, the signal patterns should be unambiguously be distinguishable from contact bounce patterns. Also, there should be a continuous monitoring as to whether more than one opening process per row or column is encountered because this would indicate that key elements of the keyboard have been inadvertently actuated twice. Duration and time of the actuation and querying from which state which key element has been actuated may be used as safety criterion.

Figure 4:
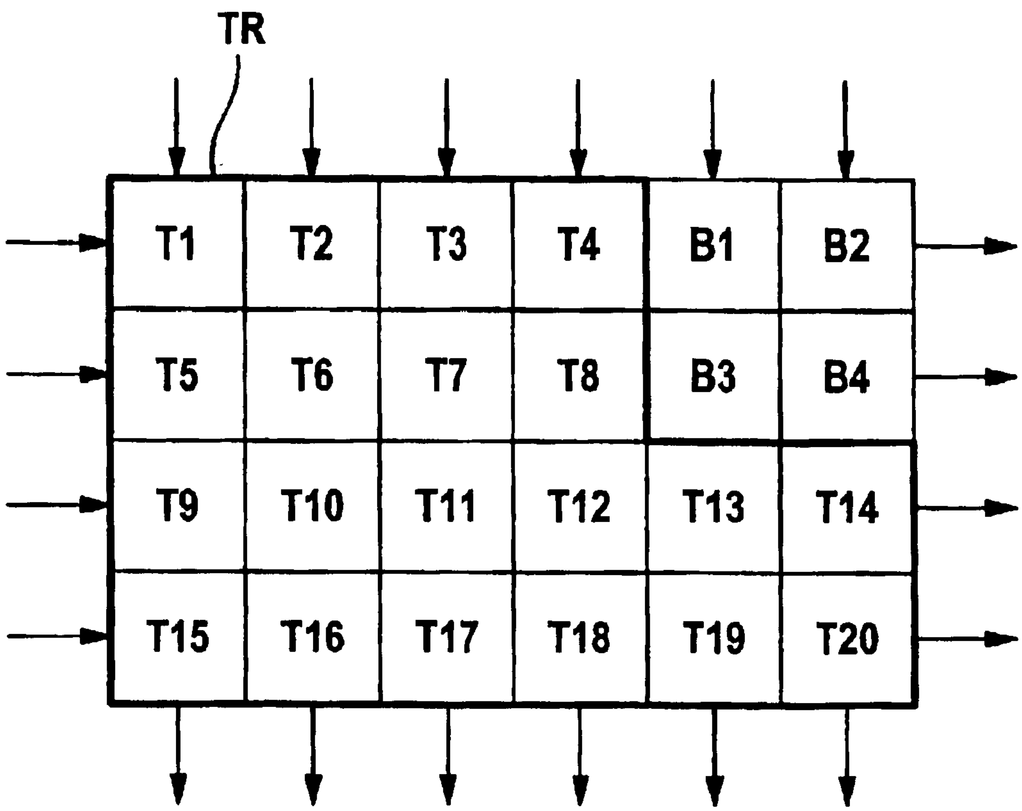
FIG. 4 is a geometric arrangement of another keyboard according to the present invention.

FIG. 4 shows a geometric arrangement of another keyboard TR according to the present invention. As depicted by way of a bold continuous line, the keyboard TR may deviate from a rectangular configuration. Assuming the case that the keyboard TR defines a cutoff rectangle of key elements T1 to T20, while positions, which would be available if the keyboard is not cutoff, are realized as blank fields B1 to B4, it is possible to simply bridge the blank fields B1 to B4 through electric paths. As a result, twenty key elements T1 to T20 have still only a number of twenty external terminals, as indicated by the arrows. Although the provision of twenty-four key elements of a keyboard that also sweeps over the blank fields would also lead to twenty external terminals. Still the overall saving of external lines, as realized by the column-row concept according to the present invention, is significant compared to the prior art because a connection of twenty key elements according to the conventional four-wire concept would result in eighty peripheral connections, and according to the three-wire concept still to sixty peripheral connections.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

1. A keyboard, comprising:

a plurality of key elements arranged in rows and columns, each said key element including first and second break contacts which are decoupled and are commonly activated, when the key element is actuated;

an energy supply unit; and an evaluation unit, wherein the energy supply unit is electrically connected to the evaluation unit serially via the first break contacts separately for each of the columns and serially via the second break contacts separately for each of the rows, thereby enabling the evaluation unit to ascertain actuation of a one of the key elements through column and row detection.

2. The keyboard of claim 1, wherein the energy supply unit generates test signals with defined signal pattern to enable the evaluation unit to monitor for compliance therewith.

3. The keyboard of claim 1, and further comprising a bidirectional connection between the energy supply unit and the evaluation unit for so coordinating the evaluation unit and the energy supply unit that respective test signals are triggered with defined signal pattern.

4. The keyboard of claim 1, and further comprising keyless matrix fields bridged electrically connected through electric paths.

* * * * *